(12) United States Patent
Rayaprolu et al.

(10) Patent No.: US 12,334,166 B2
(45) Date of Patent: Jun. 17, 2025

(54) DATA INTEGRITY CHECKS BASED ON VOLTAGE DISTRIBUTION METRICS

(71) Applicant: Micron Technology, Inc., Boise, ID (US)

(72) Inventors: Vamsi Pavan Rayaprolu, Santa Clara, CA (US); Michael Sheperek, Longmont, CO (US); Christopher M. Smitchger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/373,741

(22) Filed: Sep. 27, 2023

(65) Prior Publication Data
US 2024/0021258 A1    Jan. 18, 2024

Related U.S. Application Data

(63) Continuation of application No. 17/123,993, filed on Dec. 16, 2020, now Pat. No. 11,810,631.

(51) Int. Cl.
*G11C 29/02* (2006.01)
*G11C 29/12* (2006.01)
*G11C 29/44* (2006.01)
*G11C 29/50* (2006.01)

(52) U.S. Cl.
CPC ...... *G11C 29/021* (2013.01); *G11C 29/12005* (2013.01); *G11C 29/44* (2013.01); *G11C 29/50004* (2013.01); *G11C 2207/2254* (2013.01)

(58) Field of Classification Search
CPC . G11C 29/021; G11C 29/12005; G11C 29/44; G11C 29/50004; G11C 2207/2254; G11C 11/5642; G11C 16/26; G11C 16/3431; G11C 16/0483; G11C 29/028; G11C 29/16; G11C 16/24
See application file for complete search history.

(56) References Cited

U.S. PATENT DOCUMENTS

| | | |
|---|---|---|
| 2014/0029336 A1 | 1/2014 | Venkitachalam |
| 2017/0263311 A1* | 9/2017 | Cometti ............... G06F 11/076 |
| 2018/0341552 A1* | 11/2018 | Liikanen ............ G11C 11/5628 |
| 2018/0341553 A1 | 11/2018 | Koudele |
| 2019/0043588 A1* | 2/2019 | Fisher .................... G11C 16/26 |
| 2020/0185027 A1 | 6/2020 | Rom |
| 2022/0068401 A1* | 3/2022 | Bhatia ................ G11C 16/0483 |
| 2022/0165337 A1* | 5/2022 | Bhatia .................. H03M 13/611 |
| 2022/0165348 A1* | 5/2022 | Zuolo .................. G11C 29/028 |

* cited by examiner

*Primary Examiner* — Jerome Leboeuf
(74) *Attorney, Agent, or Firm* — Lowenstein Sandler LLP

(57) ABSTRACT

Systems and methods are disclosed including a memory device and a processing device operatively coupled to the memory device. The processing device can perform operations including determining a value of a data state metric of a memory page, wherein the data state metric value is reflective of a number of bit errors associated with the memory page; upon determining that the data state metric value satisfies a first threshold criterion, obtaining, from a neural network, a value of a voltage distribution metric associated with the page; and upon determining that the voltage distribution metric value satisfies a second threshold criterion, performing a media management operation with respect to a block associated with the page, wherein the media management operation comprises writing data stored at the block to a new block.

17 Claims, 6 Drawing Sheets

DATA INTEGRITY CHECKS BASED ON VOLTAGE DISTRIBUTION METRICS

RELATED APPLICATION

This application is a continuation of U.S. patent application Ser. No. 17/123,993, filed Dec. 16, 2020, the entire content of which is hereby incorporated by reference.

TECHNICAL FIELD

Embodiments of the disclosure relate generally to memory sub-systems, and more specifically, relate to performing a data integrity check based on voltage distribution metrics.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
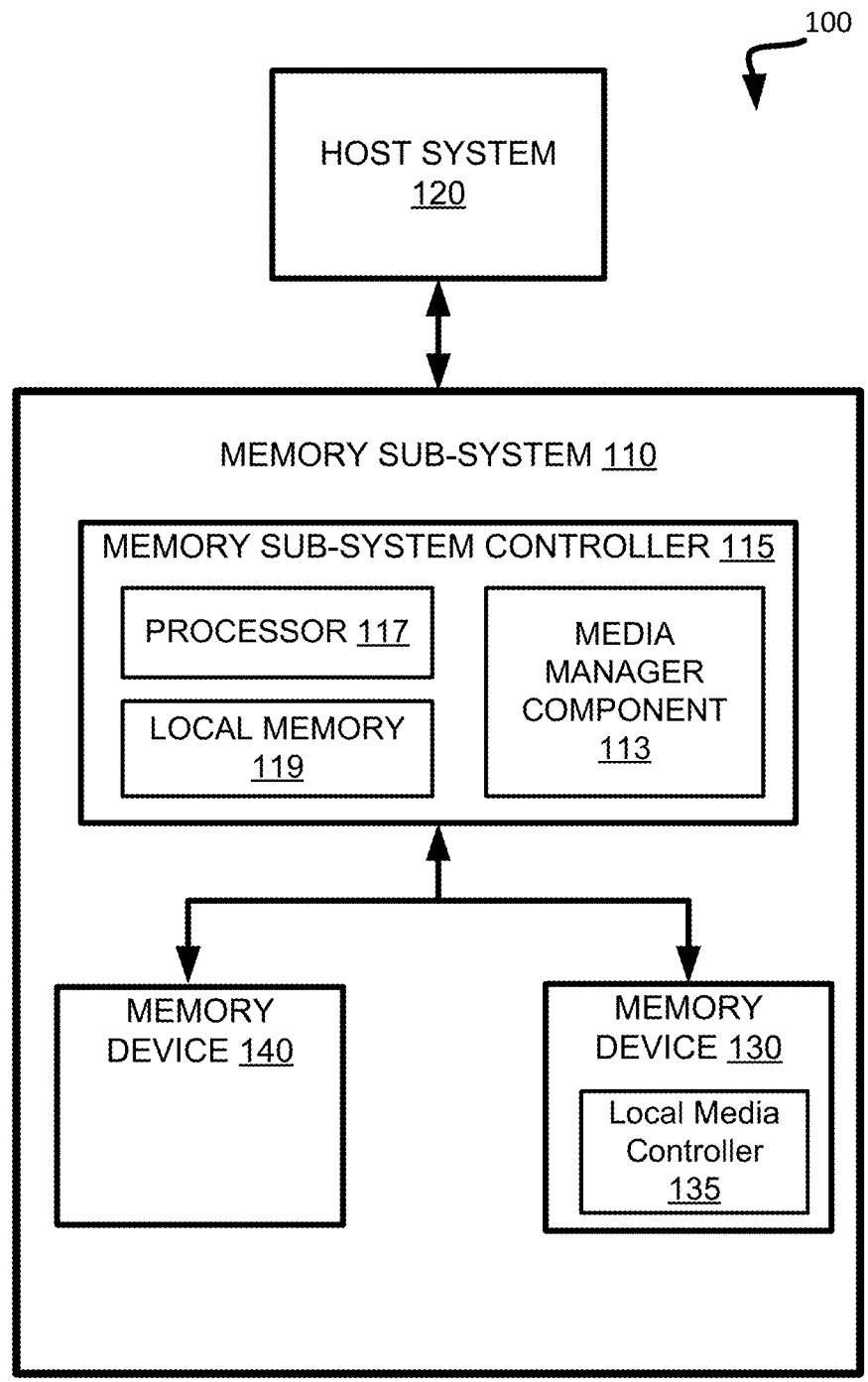
FIG. 1 illustrates an example computing system that includes a memory sub-system in accordance with some embodiments of the present disclosure.

Aspects of the present disclosure are directed to data integrity checks based on voltage distribution metrics. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high-density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single-level cell (SLC) can store only one bit per memory element, whereas a multi-level cell (MLC) is a memory element that is capable of storing more than a single bit of information.

A memory cell can be programmed (written to) by applying a certain voltage to the memory cell, which results in an electric charge being held by the memory cell, thus determining a voltage signal $V_{CG}$ that has to be applied to a control electrode of the cell to open the cell to the flow of electric current across the cell, between the source electrode and the drain electrode. More specifically, for each individual memory cell (having a charge Q stored thereon) there can be a threshold control gate voltage $V_T$ (herein also referred to as the "threshold voltage" or simply as "threshold") such that for $V_{CG} < V_T$ the source-drain electric current is low. The current increases substantially once the control gate voltage has exceeded the threshold voltage, $V_{CG} > V_T$. Because the actual geometry of the electrodes and gates varies from memory cell to memory cell, the threshold voltages $V_T$ can be different even for cells implemented on the same die. The memory cells can, therefore, be characterized by a distribution P of the threshold voltages, $P(Q, V_T) = dW/dV_T$, where dW represents the probability that any given cell has its threshold voltage within the interval $[V_T, V_T + dV_T]$ when charge Q is placed on the memory cell.

A memory device can have distributions $P(Q, V_T)$ that are narrow compared with the working range of control voltages tolerated by the cells of the device. Accordingly, multiple non-overlapping distributions $P(Q_k, V_T)$ ("valleys" or "programming distribution valleys") can be fit into the working range allowing storing and reliably detecting multiple values of the charge $Q_k$, k=1, 2, 3 . . . . The term "valleys" can relate to the shape of a graph generated by the multiple non-overlapping distributions, which can be expressed a function monotonically decreasing when its argument is below the point of the global minimum, and monotonously increasing when its argument exceeds the point of global minimum, and the graph depicting the function is symmetrical with respect to the vertical axis having the abscissa equal to the argument of the global minimum. The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels (read levels) corresponding to known valley margins (e.g., centers of the margins) of the memory device.

The higher number of possible states reduces the amount of margin (e.g., valley margin) separating the states. The memory device can include triple-level cell (TLC) memory. In TLC memory, the memory cell stores three bits of information per cell with eight total voltage states. The memory device can include a quad-level cell (QLC) memory. In QLC memory, each memory cell can store four bits of information with sixteen voltage states. For example, in a QLC memory, a memory cell can store four bits of data (e.g., 1111, 0000, 1101, etc.) corresponding to data received from the host system using the sixteen voltage states. It can be noted that operations herein can be applied to any multi-bit memory cells.

Furthermore, each bit of the memory cell is stored at a different portion (also referred to as "logical page" hereafter) of the memory cell. Various read level thresholds can be used for the various logical page types (also referred to as "page types" herein): SLC page types are lower logical pages (LPs), MLC page types are LPs and upper logical pages (UPs), TLC page types are LPs, UPs, and extra logical pages (XPs), and QLC page types are LPs, UPs, XPs and top logical pages (TPs). For example, a memory cell of the QLC memory can have a total of four logical pages, including a lower logical page (LP), an upper logical page (UP), an extra logical page (XP) and a top logical page (TP), where each logical page stores a bit of data. For example, a bit can be represented by each of the four logical pages of the memory cell. In a memory cell for QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

When data is written to a memory cell of the memory sub-system for storage, the memory cell can deteriorate. Accordingly, each memory cell of the memory sub-system can have a finite number of write operations performed on the memory cell before the memory cell is no longer able to reliably store data. Further, data stored at the memory cells can be read from the memory device and transmitted to the host system. During a read operation, a read reference voltage is applied to the wordline containing the data to be read, while a pass through voltage is applied to wordlines of unread memory cells. The pass through voltage is a read reference voltage higher than any of the stored threshold voltages. However, when data is read from a memory cell of the memory sub-system, nearby or adjacent wordlines can experience deterioration via, for example, read disturb, slow charge loss, etc. Read disturb is a phenomenon in NAND memory where reading data from a memory cell can cause the threshold voltage of unread memory cells in the same block to shift to a different value. Slow charge loss is a phenomenon where threshold voltage of a memory cell changes in time as the electric charge of the memory cell is degrading, which is referred to as "temporal voltage shift" (since the degrading electric charge causes the program distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

A memory sub-system can perform a data integrity check (also referred to herein as a "scan" or a "scan operation") to verify that the data stored at the block can be reliably read. In an example, the memory sub-system controller can select a block and perform the data integrity check on some to all of the pages of the block. During the data integrity check, which can measure and collect information about error rates associated with data, values of a data state metric are determined for data stored at the block. "Data state metric" herein shall refer to a quantity that is measured or inferred from the state of data stored on a memory device. Specifically, the data state metrics may reflect the state of the temporal voltage shift, the degree of read disturb, and/or other measurable functions of the data state. A composite data state metric is a function (e.g., a weighted sum) of a set of component state metrics. One example of a data state metric is bit error count (BEC). Another example of a data state metric is residual bit error rate (RBER). The RBER corresponds to a number of bit errors per unit of time that the data stored at the data block experiences (e.g., BEC/total bits read).

If the data state metric exceeds a threshold criterion (e.g., BEC or RBER is above a threshold value), indicating a high error rate associated with data stored at the block due, then the block can be "refreshed" by performing a media management operation (e.g., a folding operation) to relocate the data stored at the wordline or entire block to a new block of the memory sub-system. The folding of the data stored at the wordline or the block to the other block can involve writing the data stored at the wordline or the block to the other block to refresh the data stored by the memory sub-system.

However, determining the data integrity of a block based on a single data state metric (e.g., RBER or BEC) may not always be an accurate indication of a block's "health." This may lead to the memory sub-system excessively refreshing or insufficiently refreshing blocks. Excessively refreshing the blocks can increase the program/erase cycle (PEC), causing more resources of the memory sub-system to be used, thus resulting in a reduction of the performance of the memory sub-system controller due to fewer resources being available to perform other read operations or write operations. Insufficiently refreshing blocks can result in reliability issues due to a higher error rate, resulting in defective and corrupt data.

Aspects of the present disclosure address the above and other deficiencies by implementing a memory sub-system controller capable of performing a data integrity check based on programming distribution valley metrics. In an illustrative example, the memory sub-system controller can initiate a data integrity check of a block and select a page associated with the block to scan. The scan can estimate a chosen data state metric (e.g., error count) associated with the data stored at the page. If the value of the data state metric (e.g., a BEC value, a RBER value, etc.) obtained during the scan is below a threshold value, the memory sub-system controller can perform read operations on the page to obtain data that can be used to generate an error count distribution. The memory sub-system controller can then determine one or more programming distribution valley metrics (e.g., valley metrics) based on the error count distribution generated by the read operations. In an embodiment, the valley metrics include a valley margin, a valley floor, and a valley center.

If one or more valley metrics exceed a refresh threshold criterion, the memory sub-system controller can perform a media management operation, such as a folding operation, on the block. For example, the memory sub-system controller can perform the folding operation if at least one of the following conditions are met: the collapse of the valley width satisfies a threshold criterion, the shift in the valley center satisfies a threshold criterion, and/or the rise in the valley floor satisfies a threshold criterion.

Advantages of the present disclosure include, but are not limited to, an improved performance of the memory sub-system by reducing or eliminating the memory sub-system controller from excessively refreshing or insufficiently refreshing blocks. Since the number of unnecessary refreshing operations is reduced, the amount of resources of the memory sub-system devoted to performing the data integrity scans is also reduced. This can result in an improvement of performance of the memory sub-system and a decrease in power consumption by the memory sub-system.

Furthermore, reliability issues due to a higher error rate are reduced. Although embodiments are described using memory cells of a NAND flash memory, aspects of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, the memory sub-system 110 includes a media manager component 113 that can be used to implement block scan operation strategies in accordance with embodiments of the present disclosure. In some embodiments, the memory sub-system controller 115 includes at least a portion of the media manager component 113. In some embodiments, the media manager component 113 is part of the host system 120, an application, or an operating system. In other embodiments, local media controller 135 includes at least a portion of media manager component 113 and is configured to perform the functionality described herein. The media manager component 113 can communicate directly with the memory devices 130 and 140 via a synchronous interface. Furthermore, transfers of data between the memory device 130 and the memory device 140 can be done within the memory sub-system 110 without accessing the host system 120. The media manager component 113 can determine metrics associated with programming distribution valleys, as described in more detail herein below.

Figure 2:
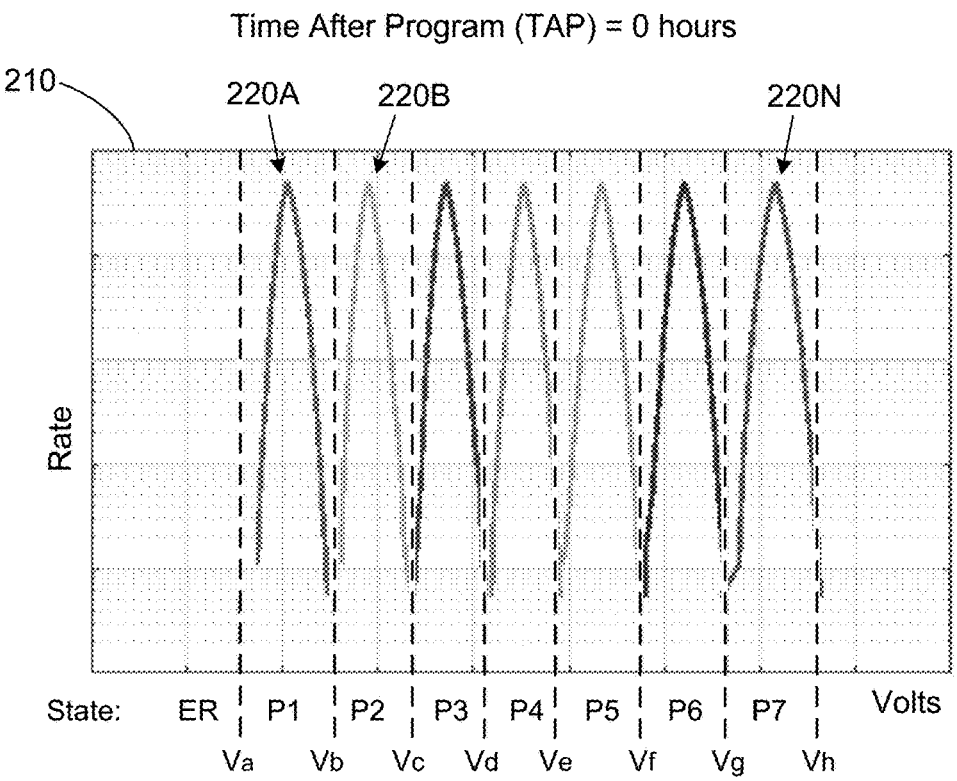
FIG. 2 schematically illustrates the data degradation caused by the slow charge loss exhibited by triple-level memory cells, in accordance with some embodiments of the present disclosure.
Figure 2:
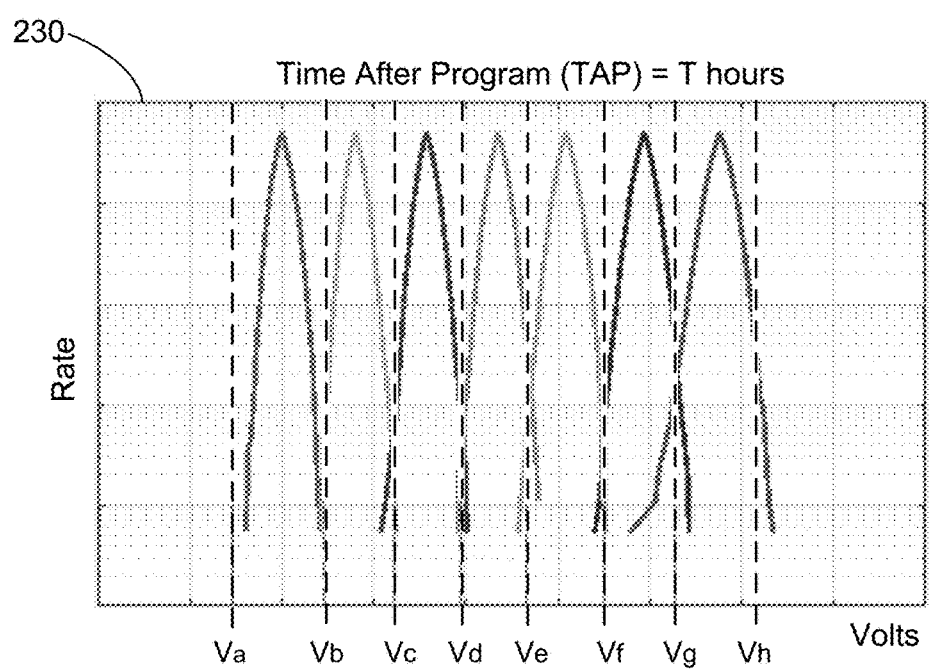

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrate program distributions 220A-220N (also referred to as "voltage distributions" or "distributions" or "programming distribution valleys" or "valleys" herein) of memory cells programmed by a respective write level (which can be assumed to be at the midpoint of the program distribution) to encode a corresponding logical level ("000" through "111" in case of a TLC). The program distributions 220A through 220N can illustrate the range of threshold voltages (e.g., normal distribution of threshold voltages) for memory cells programmed at respective write levels (e.g., program voltages). As shown, a triple-level memory cell can have seven program distribution valleys (e.g., valley 1 (210A), valley 2 (210B) . . . valley 7 (210N)). In order to distinguish between adjacent distributions (corresponding to two different logical levels), the read threshold voltage levels (shown by dashed vertical lines) are defined, such that any measured voltage that falls below a read threshold level is associated with one distribution of the pair of adjacent program distributions, while any measured voltage that is greater than or equal to the read threshold level is associated with another distribution of the pair of neighboring distributions.

In chart 210, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is the primary driver of TVS (temporal voltage shift). TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice can be referenced by its center point (e.g., 10 minutes). In various embodiments of the present disclosure, metrics associated with each of the programming distribution valleys can be measured and used to determine whether to refresh the block by performing a media management operation (e.g., a folding operation).

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
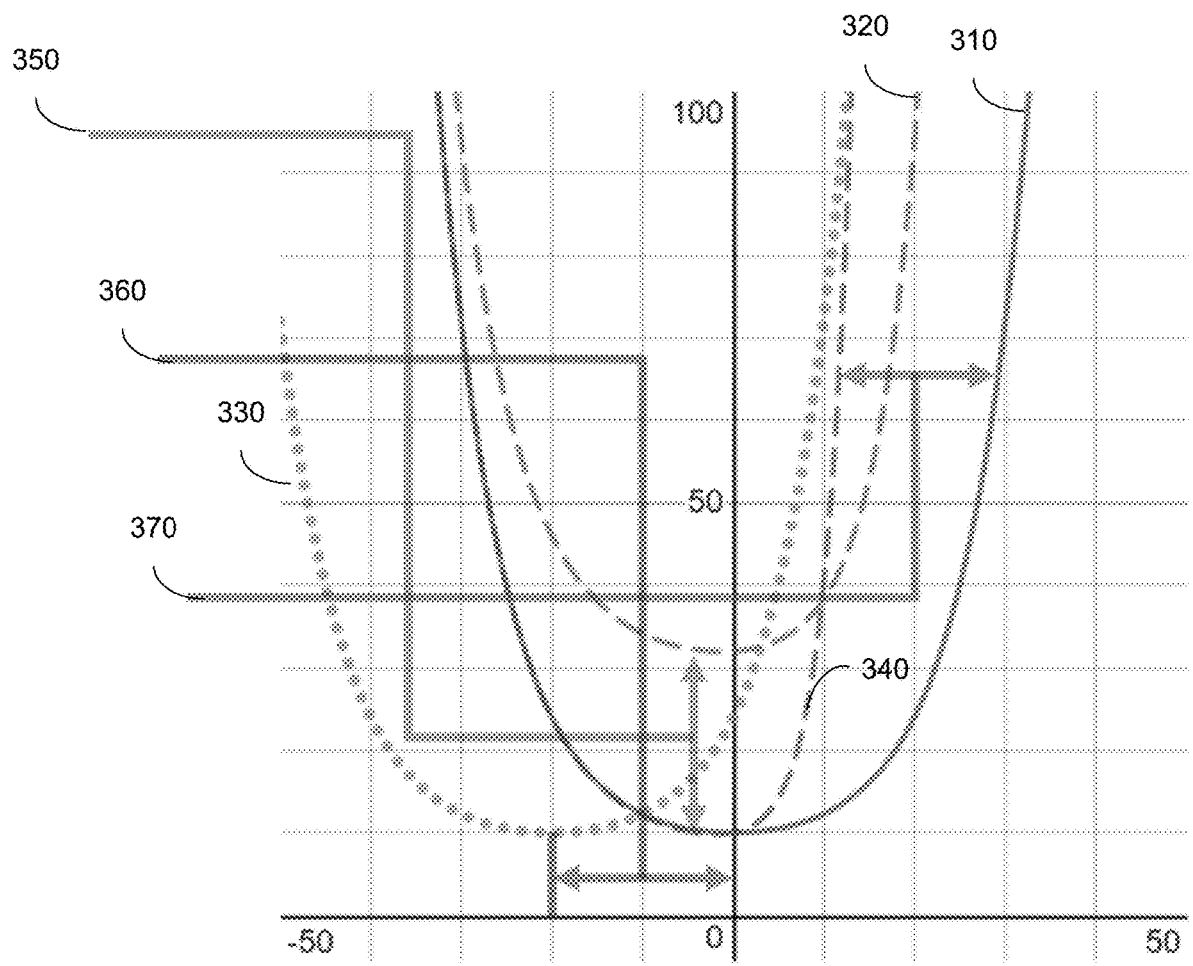
FIG. 3 depicts an example graph illustrating types of programming distribution valley degradation, in accordance with some embodiments of the present disclosure.

FIG. 3 depicts an example graph 300 illustrating types of programming distribution valley degradation. As schematically illustrated by FIG. 3, valley 310 shows an example programming distribution of freshly programmed data (e.g., TAP=0). The x-axis represents the voltage offset (in 10 millivolt (mV) steps) from the ideal read position (or level), and the y-axis represents the RBER for a 2 kb page (used by way of example), where the y-axis ranges from 0 bits in error to 100 bits in error.

In a first example of data degradation, shown at 350, valley 310 experiences an increase in the valley floor and a reduction in the valley margin, which results in a distribution shown by valley 320. The valley margin can refer to a relative width or relative margin between pairs of adjacent programming distributions. For example, valley margins associated with a particular logical page type can indicate the relative width between pairs of programming distributions associated with the particular logical page type. The valley floor indicates the distance the valley center is from the x-axis (e.g., RBER or BEC=0). As shown, the valley floor increase from an RBER of 10 bits to approximately 32 bits. In a second example of data degradation, shown at 360, valley 310 experiences a shift of two steps (e.g., 20 mV) from the ideal read position center (hereafter "valley center"), which results in a distribution shown by valley 330. A shift (hereafter "valley shift") in the valley center can increase the bit error rate. In a third example of data degradation, shown at 370, valley 310 experiences a collapse in the valley margin, while experiencing no change in the valley floor and the valley center, which results in a distribution shown by valley 340.

In various embodiments of the present disclosure, the media manager component 113 can determine programming distribution valley metrics (e.g., the valley margin, the valley floor, and the valley shift) of pages in each block of the memory sub-system 110. It is noted that valley 1 and valley 7 can be more susceptible to degradation than valleys 2-6. For example, valley 1 (210A) can have a higher rate of collapse than valleys 2-7 because valley 1 has less charge than valleys 2-7, and is thus more susceptible to read disturb and program disturb. Valley 7 (210N) can experience more voltage shift than valleys 1-6 because valley 7 has more charge than valleys 2-7, and is thus more susceptible to data retention and charge loss. Accordingly, in some embodiments, the media manager component 113 can scan only valley 1 and/or valley 7 or page types associated with valley 1 and/or valley 7 (e.g., valley 1 can be associated with LP pages and valley 7 can be associated with XP pages).

Figure 4:
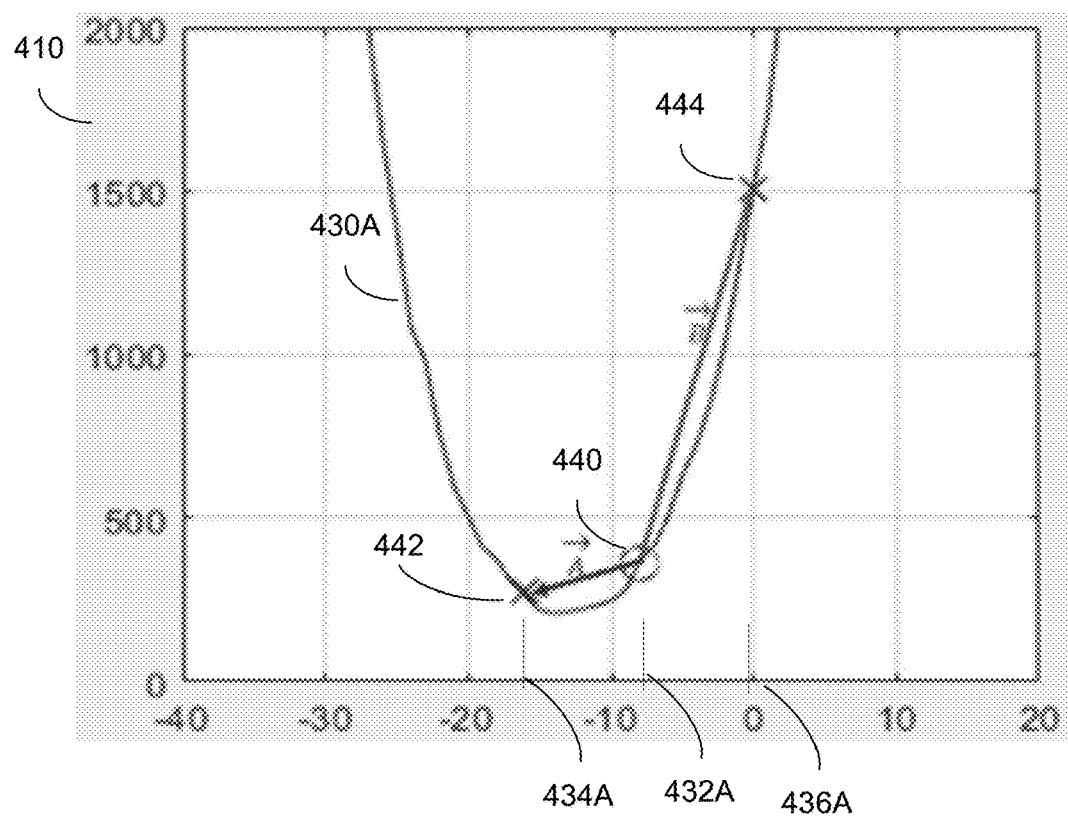
FIG. 4 schematically illustrates determining programming distribution valley metrics, in accordance with some embodiments of the present disclosure.
Figure 4:
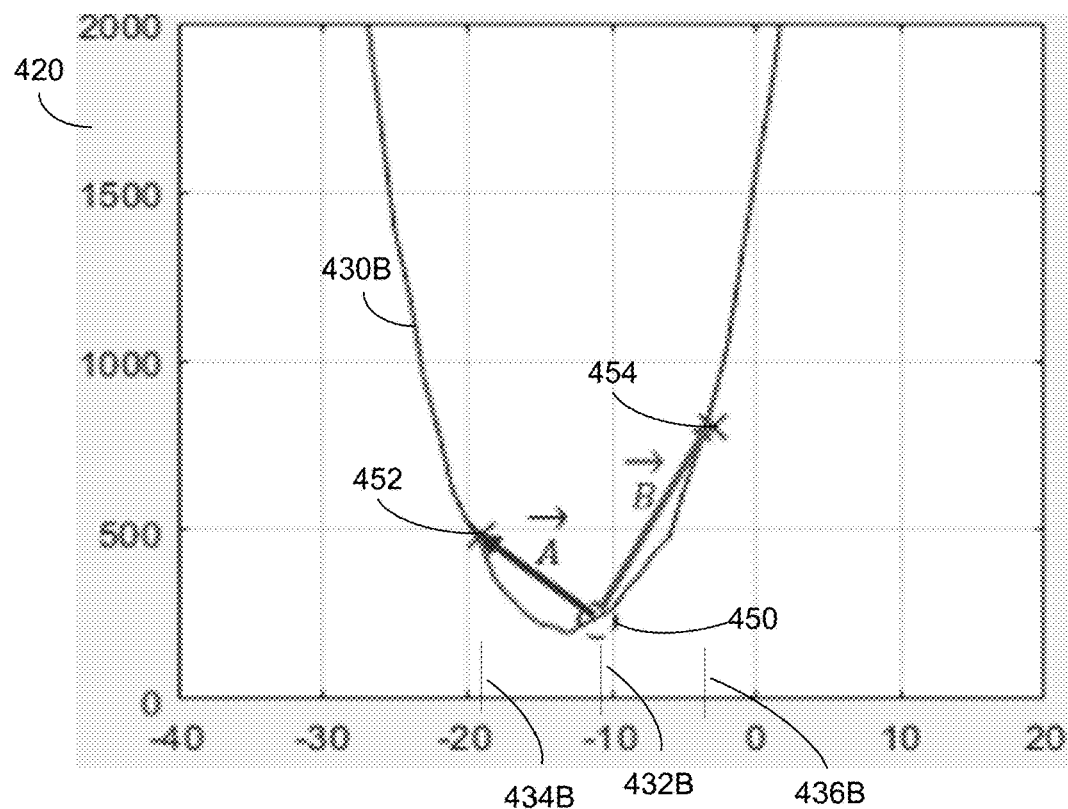

FIG. 4 schematically illustrates determining programming distribution valley metrics (also referred to as voltage distribution metrics) in greater detail. In particular, FIG. 4 depicts example graphs 410 and 420 illustrating a programming distribution valley 430A-B which correlates an error count (shown along the Y-axis) of a memory page with the read position (level) (shown along the X-axis) used in memory operations on a group of memory cells of the memory sub-system 110. The programming distribution valley 430A-B (e.g., valley) can be based on error count data corresponding to multiple read operations on a group of memory cells. For example, a page can be selected and sampled and an error count determined using a read level corresponding to a program distribution level for the memory page. After multiple read memory operations, the media manager component 113 can generate the programming distribution valley 430A-B. The programming distribution valley 430A-B can be based on the page type (e.g., LP, UP, and/or XP for a TLC type memory cells), the wordline group (WLG), the valley level (e.g., valley 1 to valley 7 for TLC type memory cells), or any combination thereof.

In some embodiments, the media manager component 113 use a vectorized read level calibration (vRLC) procedure to determine the valley margin, the valley floor, and the valley shift of the programming distribution valley. By way of example, the media manager component 113 can first sample a set of readings to determine a center result 440 based on determining the error count corresponding to the data read using a read level 432A for a particular page type of an instance of the memory pages, a left result 442 based on determining the error count using a left offset 434A, and a right result 444 based on determining the error count using a right offset 436A. For example, the left result 442 is sampled at a threshold voltage that is offset from the read level 432A by predetermined voltage magnitude in a negative voltage direction. The right result 444 is sampled at a threshold voltage that is offset from the read level 432A of the center result 440 by predetermined voltage magnitude in a positive voltage direction, as shown by right offset 436A. The left offset 434A and the right offset 436A can have a predetermined magnitude measured in ticks. A tick can be a minimum threshold voltage adjustment of the memory subsystem 110 (e.g., 10 mV, 20 mV, etc.). In some embodiments, the left offset 434A is equal in magnitude to the right offset 436A, such that the offsets are symmetrical. In other embodiments, the first and second offset magnitudes can be different (e.g., the offsets are asymmetrical)

The media manager component 113 can then generate a left vector (vector A) from the center result 440 and the left result 442, and a right vector (vector B) from the center result 440 and right result 444. The vectors can provide a status of whether the read leave 432A requires calibration. In some embodiments, the first component of each of vector A and B (referred to herein as "Ay" and "By," respectively) is based on the valley characteristic (e.g., width, depth, slope, symmetry, etc.) of the error distribution associated with the valley, and a second component of each vector A and B (referred to herein as "Ax" and "Bx," respectively) is based on the sample offset. For example, the media manager component 113 can calculate the Ax component of vector A based on a difference between the abscissa of center result 440 and the left result and calculate the Ay component of vector A based on the value of a left offset 434A. Similarly, the media manager component 113 can calculate the Bx component of the vector B based on a difference between the value of center result 440 and the value of a right result 444, and calculate the By component of the vector B based on the value of the right offset 436A. Accordingly, the magnitude of the vector A can be determined by the equation $A_m = (Ax^2 \pm Ay^2)^{1/2}$, and the magnitude of the vector B can be determined by the equation $B_m = (Bx^2 + By^2)^{1/2}$.

The media manager component 113 can determine whether the current read level of the valley is optimized (e.g., in a calibrated state) based on a comparison of the vectors A and B. For example, the media manager component 113 can determine that the current read level is at an optimal threshold level (e.g., at a valley center) if the vectors A and B satisfy a predetermined relationship to each other. In some embodiments, the predetermined relationship can be that the magnitudes of vectors A and B are equal within a predetermined limit. In some embodiments, the current read level is optimized when the phase angles of vectors A and B must satisfy a threshold criterion (e.g., predetermined relationship). For example, the predetermined relationship can be that the phase angles of the vectors A and B with respect to a central axis are equal and opposite to within a predetermined limit, as seen in graph 420.

If vectors A and B fail to satisfy a predetermined relationship to each other (e.g., are not in a calibrated state), media manager component 113 can calibrate the read level. In an embodiment, the media manager component can estimate a read level trim or offset (hereinafter "estimated offset") to be applied to the read level to generate an updated read level. The estimated offset can provide a magnitude and direction for shifting the read level from its current voltage value to the updated read level value that minimizes the error count for the read operations on the set of memory cells corresponding to the error distribution. To calculate the estimated offset, the media manager component 113 can receive and use information, including component information, associated with vectors A and B. For example, the media manager component 113 can compare the magnitudes of vectors A and B, and/or the phase angles of the vectors A and B (and/or components thereof) and estimate the offset (magnitude and direction) that the read level should be shifted. In another embodiment, the media manager component 113 can shift the read level by a predetermined voltage offset. Once the new read level (e.g., new center result 450) is determined, the media manager component 113 can determine new left result 452 and a new right result 454. The media manager component 113 can then determine a new vector A and vector B based on the new center result 450, new left result 452, new right result 454,B, and the right offset 436B, and determine whether new vectors A and B satisfy a predetermined relationship to each other. The media manager component 113 can keep performing this calibration procedure until the vectors satisfy the predetermined relationship to each other.

Once calibrated, the media manager component 113 can perform three additional read operations (e.g., a final center read, a final left read, and a final right read). Based on these values, the media manager component 113 can determine a valley margin, a valley floor, and a valley shift of the programming distribution valley. For example, the media manager component 113 can the height of the final left read and the final right read to determine a valley margin by determining a distance between both points. The media manager component 113 can use the final center read as the valley floor. The media manager component 113 determine the valley shift by determining the offset value between the initial valley center position, and the final center read.

In some embodiments, the media manager component 113 can determine the valley metrics using a curve fit model. In particular, the media manager component 113 can perform multiple read operations on a page. The media manager component 113 can then apply the voltage values (e.g., voltage offset values associated with the x-axis) and the error count values (e.g., RBER values associated with the y-axis) obtained from the read operations to the following equation: RBER=valley width*(X-valley center)$^2$+valley floor. In an example, three read operations can be sufficient to solve for values for the valley center, valley floor, and valley margin. The valley shift can be obtained by offset determining a value between the initial valley center position, and the solved for valley center. In other embodiments, other mathematical methods can be used, such as an asymmetric exponential model (e.g., y=valley floor+$2^{-L(x\text{-valley center})}$+ $2^{-R(x\text{-valley center})}$) a asymmetric parabola model (e.g., split parabola equation), etc.

Figure 5:
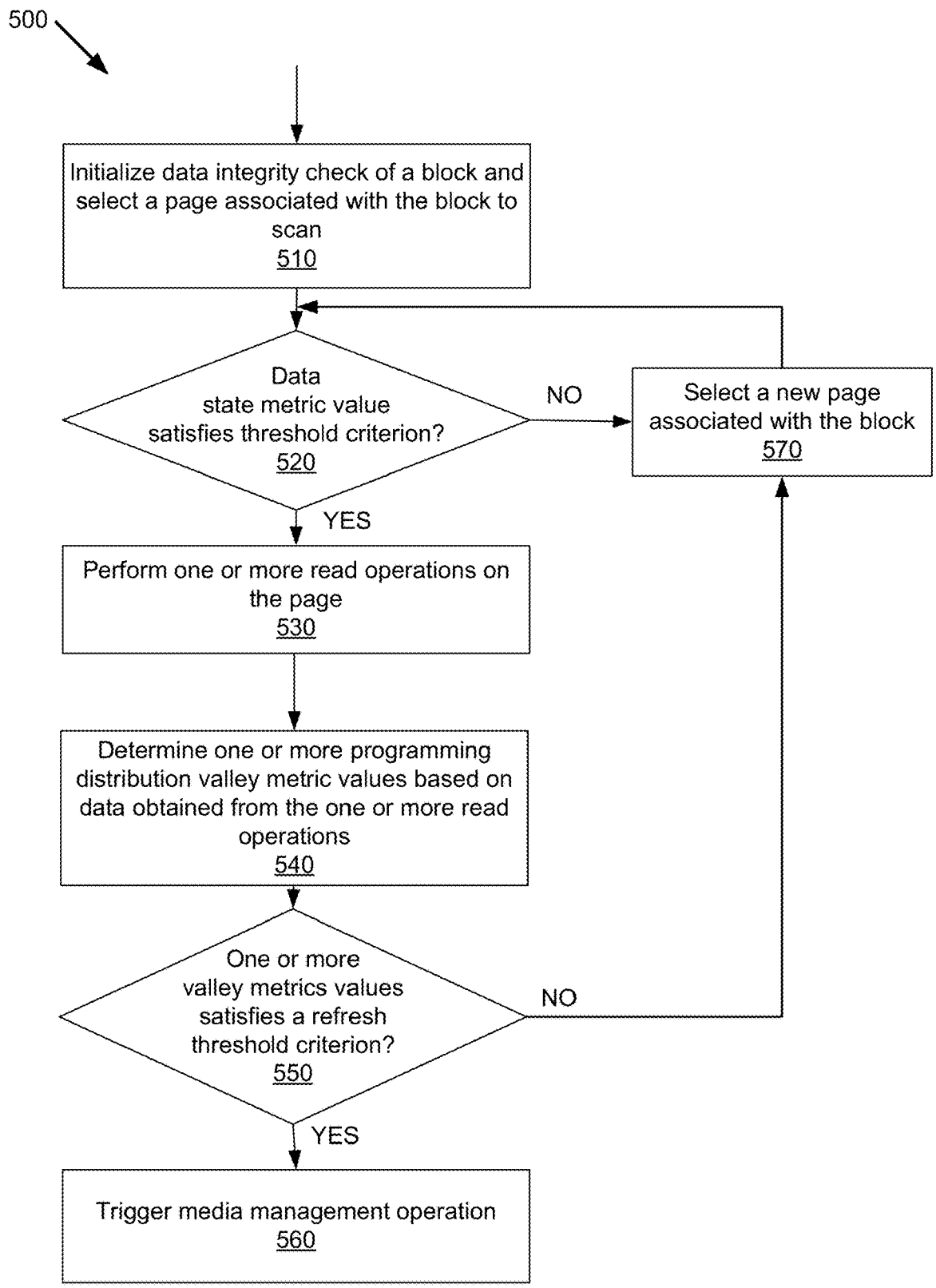
FIG. 5 a flow diagram of an example method for performing data integrity checks based on programming distribution valley metrics, in accordance with some embodiments of the present disclosure.

FIG. 5 is a flow diagram of an example method 500 for performing data integrity checks based on programming distribution valley metrics, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the media manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic of the memory sub-system controller 115 initiates a data integrity check (e.g., a scan operation) of the block and selects a page associated with the block to scan. The page can be selected randomly. The scan operation or other data integrity check can verify that the data stored at the page does not include any errors, or that the number of errors are suitably low. During the scan operation, the processing logic identifies one or more data state metric, such as the bit error count (BEC) or the raw bit error rate (RBER) representing a number of bit errors per unit of time that the data stored at the data block experiences. In some embodiments, during the scan operation, the processing logic reads a raw code word (i.e., a series of a fixed number of bits) from the page. The processing logic can apply the code word to an error correcting code (ECC) decoder to generate a decoded code word and compare the decoded code word to the raw code word. The processing logic can count a number of flipped bits between the decoded code word and the raw code word, with a ratio of the number of flipped bits to the total number of bits in the code word representing the RBER.

At operation 520, the processing logic determines whether a value of the data state metric (e.g., a BEC value, a RBER value, etc.) satisfies a threshold criterion (e.g., meets or exceeds a threshold value). For example, the processing logic can determine whether an RBER value or a BEC value exceeds a threshold value. Responsive to the data state metric value satisfying the criterion, the processing logic continues at operation 530 and performs one or more read operations on the page. The data obtained from the read operations can be used to generate an error count distribution (e.g., a valley). Otherwise, the processing logic continues at operation 570 and selects a new page, associated with the block, to scan.

In some embodiments, multiple threshold criterion can be used. For example, responsive to the RBER value or the BEC value being below a first threshold value, the processing logic can continue at operation 570, select a new page to scan, and proceed to operation 520. Responsive to the RBER value or the BEC value being between the first threshold value and a second threshold value, the processing logic can continue at operation 530 and perform multiple read operations on the page. Responsive to the RBER value or the BEC value exceeding the second threshold value, the processing logic can continue at operation 560 and perform a media management operation, such as a folding operation. In some embodiments, the threshold criterion can be adjusted based on one or more parameters. For example, a correlation between the RBER and the valley margin can be determined for each block. Based on the correlation data, each RBER value can be associated with a valley margin. Accordingly, based on a minimally accepted valley margin, the associated RBER value can be used as the threshold criterion.

At operation 540, the processing logic determines one or more values of one or more programming distribution valley metrics (e.g., voltage distribution metrics or valley metrics) based on the error count distribution generated by the one or more read operations. For example, the processing logic can determine one or more of the valley margin values associated with the page, the valley floor associated with the page, and the valley center associated with the page. Details regarding determining the valley margin, the valley floor, and the valley center are described in detail above in FIG. 4.

At operation 550, the processing logic can determine whether one or more of the values of the valley metrics satisfy a refresh threshold criterion. Responsive to one or more of the values of the valley metrics satisfying the refresh threshold criterion, the processing logic can continue at operation 560, and trigger a media management operation (e.g., a folding operation). For example, the media management operation can write the data stored at a wordline associated with the page to another block to refresh the data stored by the memory sub-system 110. In another example, the media management operation can write the data stored at the entire block to another block to refresh the data stored by the memory sub-system 110. Once the data has been written to the other block, the data stored in the initial wordline or block is erased and the initial block is available to be programmed with new data. Depending on the embodiment, the data is relocated to another block of the same plane of the same memory device, to another plane on the same memory device, or to a different memory device of the memory sub-system 110. Responsive to one or more of the valley metrics failing to satisfy the refresh threshold criterion, the processing logic can continue at operation 570 and select a new page, associated with the block, to scan.

Returning to operation 550, in some embodiments, the processing logic can first determine whether a value of a first valley metric (e.g., the valley margin) satisfies a first valley metric threshold criterion (e.g., has a width between a left read value and a right read value below a threshold value). Responsive to the first valley metric value satisfying the first valley metric threshold criterion, the processing logic can continue at operation 560 and trigger the media management operation. Responsive to the first valley metric value failing to satisfy the first valley metric threshold criterion, the processing logic can determine whether a value of a second valley metric (e.g., the valley shift) satisfies a second valley metric threshold criterion (e.g., the read level has offset by a threshold voltage value). Responsive to the second valley metric value satisfying the first valley metric threshold criterion, the processing logic can continue at operation 560 and trigger the media management operation. Responsive to the second valley metric value failing to satisfy the second valley metric threshold criterion, the processing logic can determine whether a value of a third valley metric (e.g., the valley floor) satisfies a third valley metric threshold criterion (e.g., the valley floor is above a threshold value). If the third valley metric value satisfies the threshold criterion, the processing logic can continue at operation 560 and trigger the media management operation; otherwise, the processing logic can continue at operation 570 and select a new page.

In some embodiments, any combination of the first valley metric, the second valley metric, and the third valley metric can be combined to satisfy the refresh threshold criterion. For example, responsive to the first valley metric failing to satisfy the first valley metric threshold criterion, the processing logic can then determine whether the second valley metric (e.g., the valley shift) and the third valley metric (e.g., valley floor) satisfy the second valley metric threshold criterion and the third valley metric threshold criterion. If both the second valley metric and the third valley metric satisfy their respective threshold criterion, then the processing logic can trigger the media management operation. Otherwise, if only one of (or none of) the second valley metric and the third valley metric satisfy their respective threshold criterion, then the processing logic can select a new page at operation 570.

In another embodiment, the processing logic can determine whether one or more of the valley metrics satisfy a refresh threshold criterion using a neural network. In some embodiments, the neural network can be a binary classification neural network or a feed-forward neural network. The neural network can receive three input values (e.g., the valley margin, the valley center or the valley shift, and the valley floor) and generate a binary output value. The output value can indicate whether to trigger a media management operation or select a new page. The neural network can further include one or more hidden layers. The hidden layers can process the input values to generate the output values. In some embodiments, the neural network can be trained using a supervised learning mechanism where a set of input values is provided to the neural network and its output values are compared with a desired output value. The difference between the generated output values and the desired output values can be used to adjust the weights of the neural network. The neural network can use the curve fit model, the asymmetric exponential model, the asymmetric parabola model, or any other model during the training. In some embodiments, the neural network can be trained using an unsupervised learning mechanism. In some embodiments, other machine learning models can be used.

Figure 6:
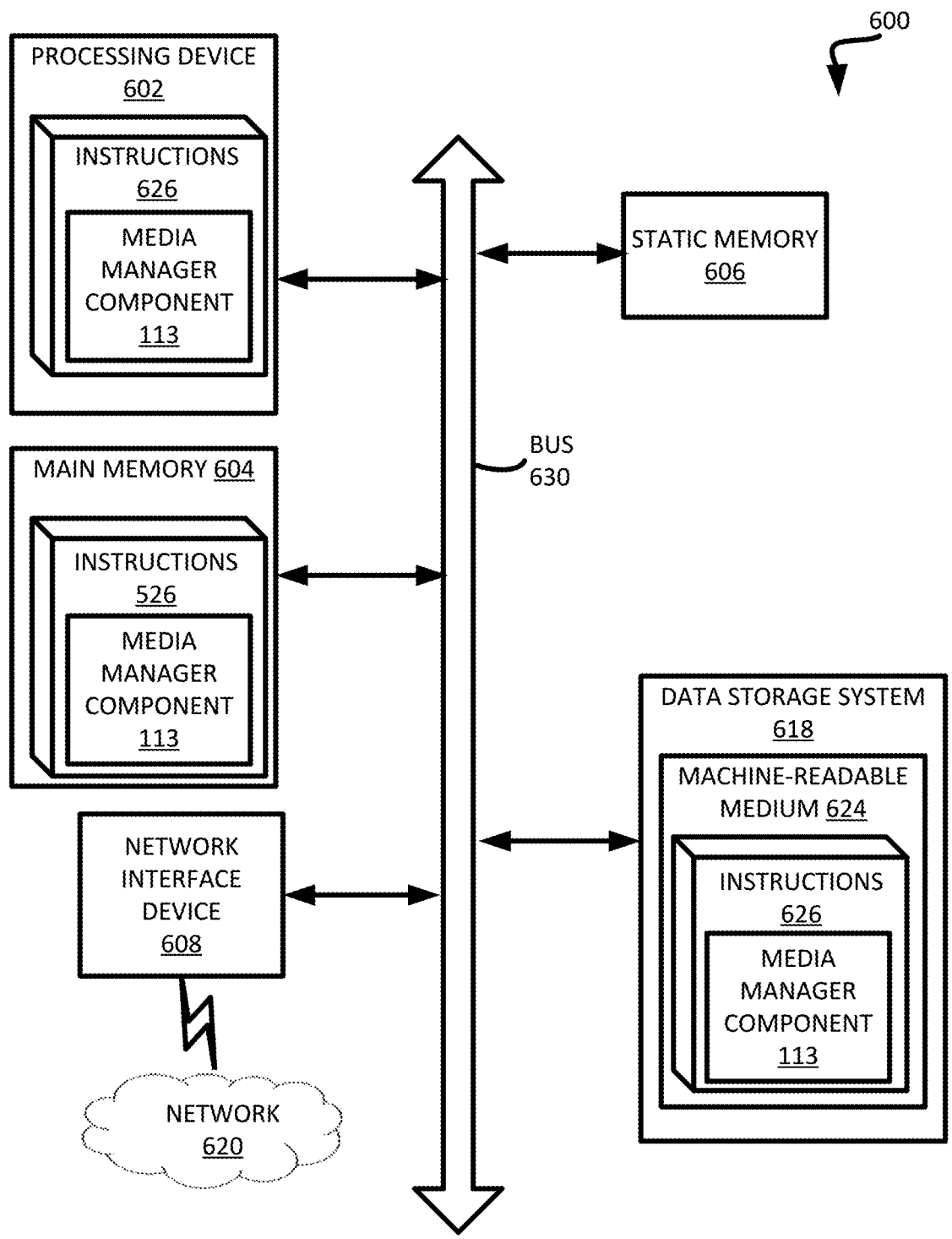
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to media manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630. Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 502 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to block manager component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled to the memory device, to perform operations comprising:
   determining a value of a data state metric of a memory page, wherein the data state metric value is reflective of a number of bit errors associated with the memory page;
   upon determining that the data state metric value satisfies a threshold criterion, providing, to a neural network, at least two different voltage distribution metrics values currently associated with the memory page, wherein each voltage distribution metrics value reflects one of a voltage distribution margin, a voltage distribution floor, or a voltage distribution center; and
   obtaining, from the neural network, a recommendation to trigger a media management operation with respect to a block associated with the memory page.

2. The system of claim 1, wherein the data state metric value comprises a raw bit error rate (RBER) or a bit error count (BER).

3. The system of claim 1, wherein one or more of the voltage distribution metric values are determined using a vectorized read level calibration (vRLC) procedure.

4. The system of claim 1, wherein the operations further comprise:
   obtaining, from the neural network, a recommendation to select a new memory page.

5. The system of claim 1, wherein the operations further comprise:
   responsive to the data state metric value failing to satisfy the threshold criterion, determining a new value of the data state metric of another memory page associated with the block.

6. The system of claim 1, wherein the media management operation comprises writing data stored at the block to a new block.

7. A method, comprising:
   determining a value of a data state metric of a memory page, wherein the data state metric value is reflective of a number of bit errors associated with the memory page;
   upon determining that the data state metric value satisfies a threshold criterion, providing, to a neural network, at least two different voltage distribution metrics values currently associated with the memory page, wherein each voltage distribution metrics value reflects one of a voltage distribution margin, a voltage distribution floor, or a voltage distribution center; and
   obtaining, from the neural network, a recommendation to trigger a media management operation with respect to a block associated with the memory page.

8. The method of claim 7, wherein the data state metric value comprises a raw bit error rate (RBER) or a bit error count (BER).

9. The method of claim 7, wherein one or more of the voltage distribution metric values are determined using a vectorized read level calibration (vRLC) procedure.

10. The method of claim 7, wherein:
    obtaining, from the neural network, a recommendation to select a new memory page.

11. The method of claim 7, further comprising:
    responsive to the data state metric value failing to satisfy the threshold criterion, determining a new value of the data state metric of another memory page associated with the block.

12. The method of claim 7, wherein the media management operation comprises writing data stored at the block to a new block.

13. A non-transitory computer-readable storage medium comprising instructions that, when executed by a processing device operatively coupled to a memory, performs operations comprising:
    determining a value of a data state metric of a memory page, wherein the data state metric value is reflective of a number of bit errors associated with the memory page;
    upon determining that the data state metric value satisfies a threshold criterion, providing, to a neural network, at least two different voltage distribution metrics values currently associated with the memory page, wherein each voltage distribution metrics value reflects one of a voltage distribution margin, a voltage distribution floor, or a voltage distribution center; and obtaining, from the neural network, a recommendation to trigger a media management operation with respect to a block associated with the memory page.

14. The non-transitory computer-readable storage medium of claim 13, wherein the data state metric value comprises a raw bit error rate (RBER) or a bit error count (BER).

15. The non-transitory computer-readable storage medium of claim 13, wherein one or more of the voltage distribution metric values are determined using a vectorized read level calibration (vRLC) procedure.

16. The non-transitory computer-readable storage medium of claim 13, wherein the operations further comprise:

obtaining, from the neural network, a recommendation to select a new memory page.

17. The non-transitory computer-readable storage medium of claim 13, wherein the operations further comprise:

responsive to the data state metric value failing to satisfy the threshold criterion, determining a new value of the data state metric of another memory page associated with the block.

* * * * *